United States Patent
Su et al.

(10) Patent No.: US 11,777,458 B2
(45) Date of Patent: Oct. 3, 2023

(54) POWER CONTROL DEVICE AND METHOD, AND STORAGE MEDIUM

(71) Applicant: SMARTER MICROELECTRONICS (GUANG ZHOU) CO., LTD., Guangzhou (CN)

(72) Inventors: Qiang Su, Guangzhou (CN); Jinliang Deng, Guangzhou (CN); Yang Hou, Guangzhou (CN); Jiangtao Yi, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 458 days.

(21) Appl. No.: 17/139,865

(22) Filed: Dec. 31, 2020

(65) Prior Publication Data

US 2021/0226594 A1 Jul. 22, 2021

Related U.S. Application Data

(63) Continuation of application No. PCT/CN2020/117178, filed on Sep. 23, 2020.

(30) Foreign Application Priority Data

Jan. 19, 2020 (CN) .......................... 202010058511.4

(51) Int. Cl.
*H03F 3/191* (2006.01)
*H03F 3/24* (2006.01)
(Continued)

(52) U.S. Cl.
CPC ............. *H03F 3/245* (2013.01); *H03F 1/565* (2013.01); *H03F 3/195* (2013.01); *H03F 3/72* (2013.01);
(Continued)

(58) Field of Classification Search
CPC ...................................................... H03F 3/191
(Continued)

(56) References Cited

U.S. PATENT DOCUMENTS 8,319,549 B2 * 11/2012 Sengupta .............. H03F 1/0266
330/124 R
10,038,414 B2 * 7/2018 Ranta ...................... H03F 3/213
(Continued)

*Primary Examiner* — Henry Choe
(74) *Attorney, Agent, or Firm* — SYNCODA LLC; Feng Ma

(57) ABSTRACT

A power control device includes: a controller configured to, when a frequency band selection instruction is detected, determine a target frequency band from the frequency band selection instruction in response to the frequency band selection instruction; and to determine, based on the target frequency band, a target inter-stage matching circuit of a path from a plurality of inter-stage matching circuits; a driving element configured to, when an input power signal within the target frequency band is received, pre-amplify the input power signal to obtain a pre-amplified power signal and transmit the pre-amplified power signal to the target inter-stage matching circuit; the target inter-stage matching circuit configured to process the pre-amplified power signal to obtain an intermediate input signal and provide the intermediate input signal to a power stage amplification circuit; the power stage amplification circuit configured to amplify the intermediate input signal to obtain an output power signal.

18 Claims, 5 Drawing Sheets

(51) Int. Cl.
*H03F 3/195* (2006.01)
*H03F 1/56* (2006.01)
*H03F 3/72* (2006.01)

(52) U.S. Cl.
CPC .. *H03F 2200/318* (2013.01); *H03F 2200/451* (2013.01)

(58) Field of Classification Search
USPC .................................................. 330/305, 302
See application file for complete search history.

(56) References Cited

U.S. PATENT DOCUMENTS

| | | | |
|---|---|---|---|
| 10,171,053 B2 * | 1/2019 | Soliman | H03F 1/0227 |
| 11,575,351 B2 * | 2/2023 | Ranta | H03F 3/213 |
| 2005/0083117 A1 * | 4/2005 | Kim | H03F 1/32 |
| | | | 330/51 |
| 2018/0219516 A1 * | 8/2018 | Soliman | H03L 7/24 |

* cited by examiner

POWER CONTROL DEVICE AND METHOD, AND STORAGE MEDIUM

CROSS-REFERENCE TO RELATED APPLICATIONS

This application is a continuation of International Application No. PCT/CN2020/117178 filed on Sep. 23, 2020, which claims priority to Chinese Patent Application No. 202010058511.4 filed on Jan. 19, 2020. The disclosures of these applications are hereby incorporated by reference in their entirety.

BACKGROUND

Presently, power amplifier is a very important key element for wireless communication, with the development of Long Term Evolution (LTE) of universal mobile communication technology, and New Radio (NR) of 5th-Generation mobile communication technology (5G New Radio), the coexistence of various systems requires the power amplifier to support multi-mode and multi-frequency (multiple network systems and multiple frequency bands); the related art integrates multi-channel power amplifiers to generate a power amplification chip, which can support multiple systems and multiple frequency bands.

SUMMARY

The present disclosure relates generally to wireless communication technologies, and more specifically to a power control device and method, and a storage medium.

Various embodiments of the disclosure provide a power control device and method and a storage medium, which can improve the space utilization.

Some embodiments of the disclosure provide a power control device, which includes:

a controller, a driving element, an adjustable inter-stage matching circuit and a power stage amplification circuit, herein the controller and the driving element are connected with the adjustable inter-stage matching circuit respectively, the adjustable inter-stage matching circuit is connected with the power stage amplification circuit; and the adjustable inter-stage matching circuit includes multiple inter-stage matching circuits which are connected with the power stage amplification circuit;

the controller configured to, when a frequency band selection instruction is detected, determine a target frequency band from the frequency band selection instruction in response to the frequency band selection instruction; and to determine, based on the target frequency band, a target inter-stage matching circuit of a path from the multiple inter-stage matching circuits;

the driving element configured to, when an input power signal within the target frequency band is received, pre-amplify the input power signal to obtain a pre-amplified power signal and transmit the pre-amplified power signal to the target inter-stage matching circuit;

the target inter-stage matching circuit configured to process the pre-amplified power signal to obtain an intermediate input signal and provide the intermediate input signal to the power stage amplification circuit; and the power stage amplification circuit configured to amplify the intermediate input signal to obtain an output power signal.

In the above solution, the adjustable inter-stage matching circuit further includes multiple switches connected in parallel, the multiple switches are connected with the multiple inter-stage matching circuits in one-to-one correspondence, and the multiple switches are connected with an output end of the driving element and the controller; and the controller is further configured to determine, according to correspondences among the target frequency band, a preset frequency band and a matching circuit switch, a target switch from the multiple switches; and to control the target switch to be switched on and control other switches, except the target switch, of the multiple switches to be switched off; and to set an inter-stage matching circuit, connected with the target switch, of the multiple inter-stage matching circuits as the target inter-stage matching circuit.

In the above solution, the power stage amplification circuit includes multiple power amplifiers which are connected with the multiple inter-stage matching circuits in one-to-one correspondence;

the controller is further configured to, after determining the target inter-stage matching circuit of the path from the multiple inter-stage matching circuits, set an amplifier, connected with the target inter-stage matching circuit, of the multiple power amplifiers as a target power amplifier; and the target power amplifier is configured to amplify the intermediate input signal to obtain the output power signal.

In the above solution, the target inter-stage matching circuit is further configured to transmit, by a preset capacitor and a preset inductor, the pre-amplified power signal to obtain the intermediate input signal; and the preset capacitor and the preset inductor make an output impedance of the driving element match with an input impedance of the target power amplifier.

In the above solution, each of the multiple inter-stage matching circuits and a power amplifier, correspondingly connected thereto, of the multiple power amplifiers are configured to output power signals within a frequency band with maximum efficiency.

In the above solution, a power control device further includes multiple input matching circuits and multiple input switches; and the multiple input matching circuits are connected with the multiple input switches in one-to-one correspondence, and the multiple input switches are connected with the controller and the input end of the driving element;

the controller is further configured to set an input switch, corresponding to the target inter-stage matching circuit, of the multiple input switches as a target input switch; and to control the target input switch to be switched on and control other input switches, except the target input switch, of the multiple input switches to be switched off; and to set an input matching circuit, connected with the target input switch, of the multiple input matching circuits as a target input matching circuit; and the target input matching circuit is configured to transmit the input power signal to the driving element.

The embodiments of the disclosure provide a power control method applied to any of the above power control devices, the method including:

when the frequency band selection instruction is detected, determining, by the controller, the target frequency band from the frequency band selection instruction in response to the frequency band selection instruction; and determining, by the controller based on the target frequency band, the target inter-stage matching circuit of the path from the multiple inter-stage matching circuits;

when the input power signal within the target frequency band is received by the driving element, pre-amplifying, by the driving element, the input power signal to obtain the pre-amplified power signal and transmit the pre-amplified power signal to the target inter-stage matching circuit;

processing, by the target inter-stage matching circuit, the pre-amplified power signal to obtain the intermediate input signal and provide the intermediate input signal to the power stage amplification circuit; and amplifying, by the power stage amplification circuit, the intermediate input signal to obtain the output power signal.

In the above solution, the determining, based on the target frequency band, the target inter-stage matching circuit of the path from the multiple inter-stage matching circuits, includes:

determining, by the controller, the target switch from the multiple switches, according to correspondences among the target frequency band, the preset frequency band and the matching circuit switch;

controlling, by the controller, the target switch to be switched on, and controlling, by the controller, other switches, except the target switch, of the multiple switches to be switched off; and setting, by the controller, the inter-stage matching circuit, connected with the target switch, of the multiple inter-stage matching circuits as the target inter-stage matching circuit.

In the above embodiments, the method further includes: after determining, based on the target frequency band, the target inter-stage matching circuit of the path from the multiple inter-stage matching circuits, and before amplifying, by the power stage amplification circuit, the intermediate input signal to obtain the output power signal, setting, by the controller, the amplifier, connected with the target inter-stage matching circuit, of the multiple power amplifiers as the target power amplifier;

correspondingly, the amplifying, by the power stage amplification circuit, the intermediate input signal to obtain the output power signal, including:

amplifying, by the target power amplifier, the intermediate input signal to obtain the output power signal.

In the above solution, the processing, by the target inter-stage matching circuit, the pre-amplified power signal to obtain the intermediate input signal and provide the intermediate input signal to the power stage amplification circuit, includes:

transmitting, by the target inter-stage matching circuit, the pre-amplified power signal by the preset capacitor and the preset inductor to obtain the intermediate input signal; and the preset capacitor and the preset inductor make the output impedance of the driving element match with the input impedance of the target power amplifier.

In the above solution, the method further includes: before the pre-amplifying, by the driving element, the input power signal to obtain the pre-amplified power signal and transmit the pre-amplified power signal to the target inter-stage matching circuit, setting, by the controller, the input switch, corresponding to the target inter-stage matching circuit, of the multiple input switches as the target input switch;

controlling, by the controller, the target input switch to be switched on and controlling, by the controller, other input switches, except the target input switch, of the multiple input switches to be switched off;

setting, by the controller, the input matching circuit, connected with the target input switch, of the multiple input matching circuits as the target input matching circuit; and transmitting, by the target input matching circuit, the input power signal to the driving element.

Some embodiments of the disclosure provide a computer-readable storage medium, storing one or more programs which may be executed by one or more processors to implement any of the above power control methods.

Some embodiments of the disclosure provide a power control device and method and a storage medium, with the above technical solutions, when a target frequency band is determined from a frequency band selection instruction, only a target inter-stage matching circuit path of multiple inter-stage matching circuits is selected, and then an input power signal within the target frequency band is pre-amplified by a driving element, processed by the target inter-stage matching circuit and amplified by a power amplification circuit to obtain an output power signal, and because the driving element is configured to pre-amplify the input power signal only, regardless of the frequency band, that is to say, no matter whether the input power signal belongs to any of the frequency bands, it may be pre-amplified by the same driving element, therefore, the topology of the power control device is simplified by sharing one driving element for each of the frequency bands, improving the space utilization.

DETAILED DESCRIPTION

The technical solutions of the embodiments of the disclosure will be described clearly and completely below with reference to the drawings of the embodiments of the disclosure.

Because each power amplifier in the multi-channel power amplifier includes a power stage and a driving stage, that is, the power amplification chip is composed of multiple driving stages, which results in the power amplification chip having a complex structure, a large size and low space utilization.

Figure 1:
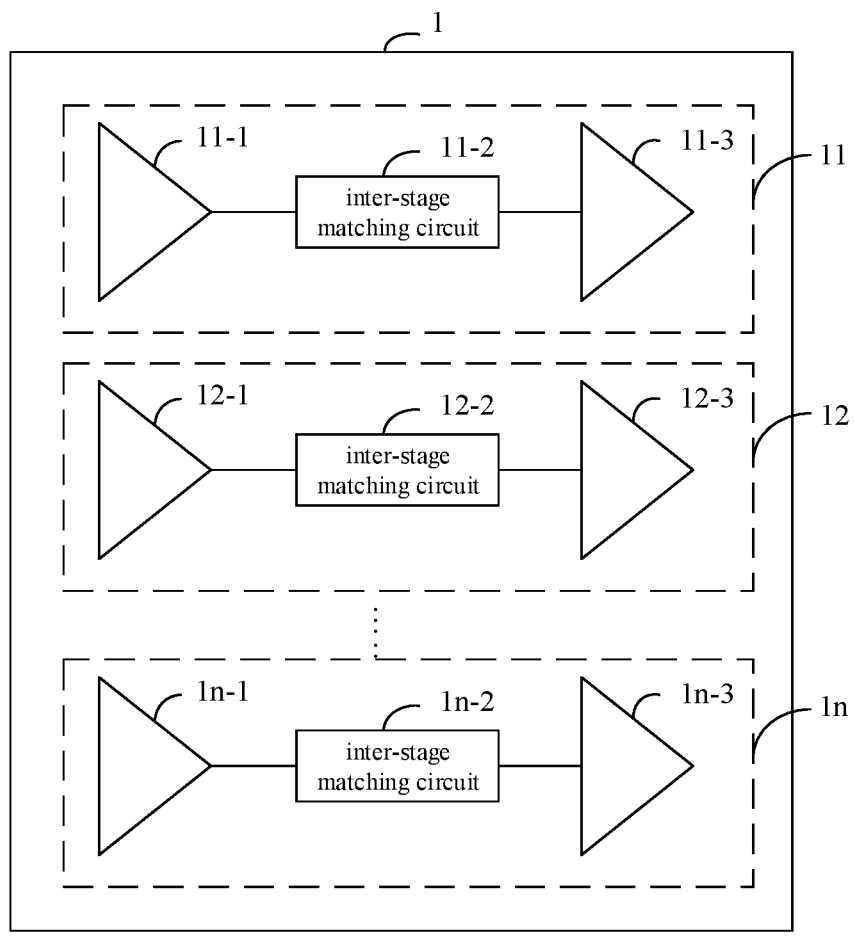
FIG. 1 is the first schematic structural diagram of a power control device provided by an embodiment of the disclosure.

FIG. 1 is a schematic diagram of a power control device provided by an embodiment of the disclosure, the power control device 1 includes multiple power amplification branches including a power amplification branch 11, a power amplification branch 12, . . . , and a power amplification branch 1n, here n is a positive integer greater than 2; herein, the power amplification branch 11 includes a driving element 11-1, an inter-stage matching circuit 11-2 and a power amplifier 11-3; and the power amplification branch 12 includes a driving element 12-1, an inter-stage matching circuit 12-2 and a power amplifier 12-3; and the power amplification branch 1n includes a driving element 1n-1, an inter-stage matching circuit 1n-2 and a power amplifier 1n-3; herein each of the inter-stage matching circuits is configured to adjust the output impedance of the driving element in the same power amplification branch and the input impedance of the power amplifier in the same power amplification branch.

With the development of mobile communication technology, the ranges of signal bandwidth and frequency used by a communication system become wider and wider, however, the amplification gain of each of the power amplification branches is limited, and it may only process frequency signals within a limited frequency band, and in order to allow the power control device 1 to support multiple network systems and multiple frequency bands, multiple power amplification branches supporting frequency signals in different frequency bands are integrated to obtain the power control device 1; herein multiple network systems include Code Division Multiple Access (CDMA), Global System for Mobile Communications (GSM), 4th generation mobile communication technology (4G), 5th generation mobile communication technology (5G), etc., and multiple frequency bands include the frequency bands occupied by each of the systems, such as frequency bands of 900/1800/1900 MHz occupied by GSM and 1920-2170 MHz occupied by 4G.

Based on the power control device shown in FIG. 1, when it is necessary to process the output power signal of a certain frequency band under a certain network system, a corresponding power amplification branch in the power control device 1 is adopted, which receives and amplifies the input power signal, and outputs the power signal.

It should be noted that since the power control device 1 includes multiple power amplification branches and each of the power amplification branches includes a driving element, the power control device 1 includes multiple driving elements, which results in a complex structure, large size and low space utilization of the power control device 1.

Figure 2:
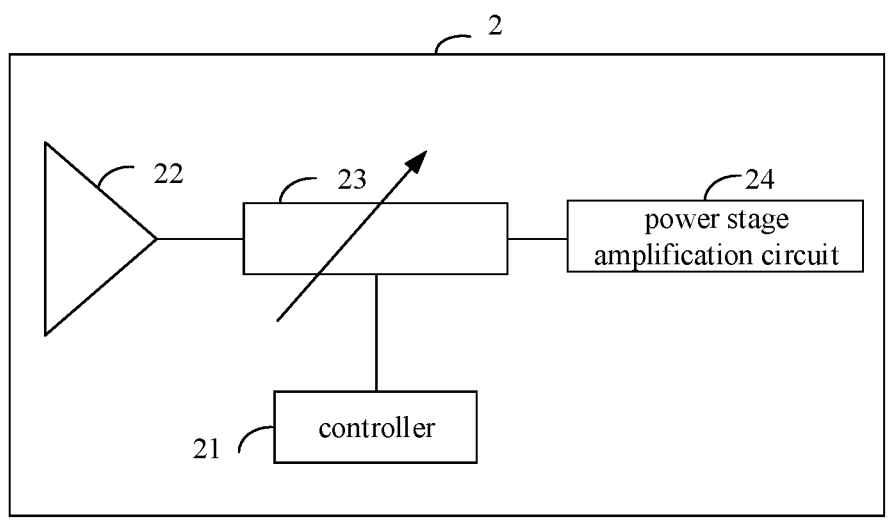
FIG. 2 is the second schematic structural diagram of a power control device provided by an embodiment of the disclosure.

The embodiments of the disclosure provide a power control device, as shown in FIG. 2, the power control device 2 includes a controller 21, a driving element 22, an adjustable inter-stage matching circuit 23 and a power stage amplification circuit 24, herein the controller 21 and the driving element 22 are connected with the adjustable inter-stage matching circuit 23 respectively, the adjustable inter-stage matching circuit 23 is connected with the power stage amplification circuit 24; and the adjustable inter-stage matching circuit 23 includes multiple inter-stage matching circuits which are connected with the power stage amplification circuit 24; the controller 21 is configured to, when a frequency band selection instruction is detected, determine a target frequency band from the frequency band selection instruction in response to the frequency band selection instruction; and to determine, based on the target frequency band, a target inter-stage matching circuit of a path from the multiple inter-stage matching circuits; a driving element 22 is configured to, when an input power signal within the target frequency band is received, pre-amplify the input power signal to obtain a pre-amplified power signal; the adjustable inter-stage matching circuit 23 is configured to process the pre-amplified power signal to obtain an intermediate input signal and provide the intermediate input signal to the power stage amplification circuit; and the power stage amplification circuit 24 is configured to amplify the intermediate input signal to obtain an output power signal.

When the power control device needs to process (for example, amplify and transmit) the power signal in a certain target frequency band under a certain network system, the power control device makes the controller receive the frequency band selection instruction, and as a response, to determine the target frequency band; determine a target inter-stage matching circuit whose operating frequency band is the target frequency band from multiple inter-stage matching circuits, and form an operating path by the target inter-stage matching circuit, a driving element and a power stage amplification circuit; control the input power signal to be pre-amplified by the driving element 22, processed by the target inter-stage matching circuit, and amplified by the power stage amplification circuit 24 to obtain an output power signal.

In some embodiments, the driving element includes a triode or a Metal-Oxide-Semiconductor Field-Effect Transistor (MOSFET), etc.

It should be noted that because the amplitude of the input power signal is limited and the output gain of the power stage amplification circuit is limited, the driving element is configured to pre-amplify the input power signal to obtain the output power signal within a certain frequency band.

In some embodiments, the multiple inter-stage matching circuits are circuits operating in different frequency bands; each of the multiple inter-stage matching circuits provides a matching impedance required by a frequency band to the driving element and the power stage amplification circuit, and an operating path formed by each of the inter-stage matching circuits, the driving element and the power stage amplification circuit may process power signals within the frequency band with the best performance parameters.

It should be noted that the multiple inter-stage matching circuits share one driving element to amplify power signals within multiple frequency bands, thus, the multiple inter-stage matching circuits that may provide matching impedances required by the multiple frequency bands may broaden the width of the frequency band, and simplify the topology of the power control device by sharing one driving element, thus reducing the size of the power control device.

In some embodiments, each of the multiple inter-stage matching circuits includes an inductor and a capacitor.

Figure 3A:
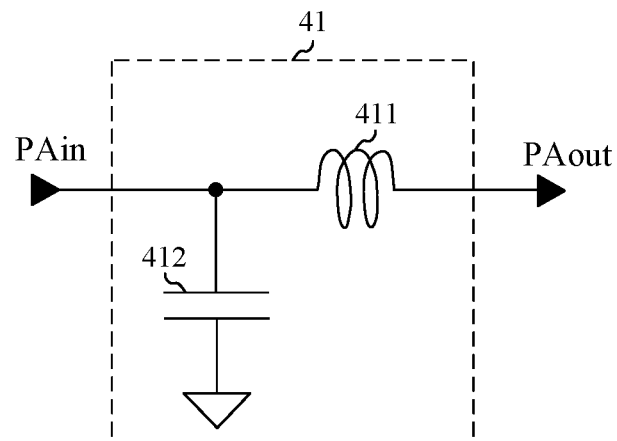
FIG. 3A is the first schematic structural diagram of an inter-stage matching circuit provided by an embodiment of the disclosure.

For example, as shown in FIG. 3A, an inter-stage matching circuit 41 includes a serially connected inductor 411, as well as a shunt capacitor 412, herein the inductor 411 is coupled between an input end PAin and an output end PAout of the inter-stage matching circuit 41; and the capacitor 412 is coupled between the input end PAin of the inter-stage matching circuit 41 and the ground circuit.

Figure 3B:
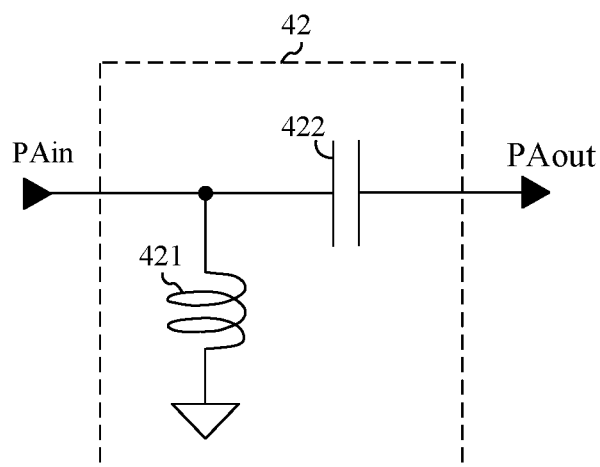
FIG. 3B is the second schematic structural diagram of an inter-stage matching circuit provided by an embodiment of the disclosure.

For example, as shown in FIG. 3B, an inter-stage matching circuit 42 includes a shunt inductor 421, as well as a serially connected capacitor 422, herein the inductor 421 is coupled between an input end PAin of the inter-stage matching circuit 42 and the ground circuit; and the capacitor 422 is coupled between the input end PAin and an output end PAout of the inter-stage matching circuit 42.

Figure 3C:
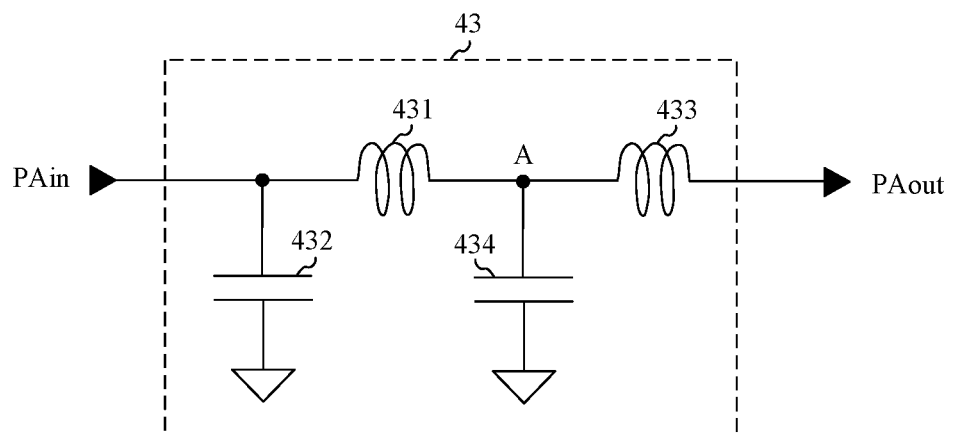
FIG. 3C is the third schematic structural diagram of an inter-stage matching circuit provided by an embodiment of the disclosure.

For example, as shown in FIG. 3C, an inter-stage matching circuit 43 is an inter-stage matching circuit with two sections, including a first section including a serially connected inductor 431, as well as a shunt capacitor 432, and a second section including a serially connected inductor 433, as well as a shunt capacitor 434; herein the inductor 431 is coupled between an input end PAin of the inter-stage matching circuit 43 and a node A; the capacitor 432 is coupled between the input end PAin of the inter-stage matching circuit 43 and the ground circuit; the inductor 433 is coupled between the node A and an output end PAout of the inter-stage matching circuit 43; and the capacitor 434 is coupled between the node A and the ground circuit.

It should be noted that FIGS. 3A to 3C only show several exemplary designs of any of the multiple inter-stage matching circuits, and do not limit the design of any inter-stage matching circuit.

In some embodiments, the target inter-stage matching circuit is also configured to transmit, by a preset capacitor and a preset inductor, the pre-amplified power signal to obtain the intermediate input signal; and the preset capacitor and the preset inductor make an output impedance of the driving element match with an input impedance of the target power amplifier.

The capacitor in the target inter-stage matching circuit is set as the preset capacitor and the inductor in the target inter-stage matching circuit is set as a preset inductor; the target inter-stage matching circuit makes the output impedance of the connected driving element match with the input impedance of the target power amplifier by a preset inductor with a certain inductance value and a preset capacitor with a certain capacitance value.

Figure 4:
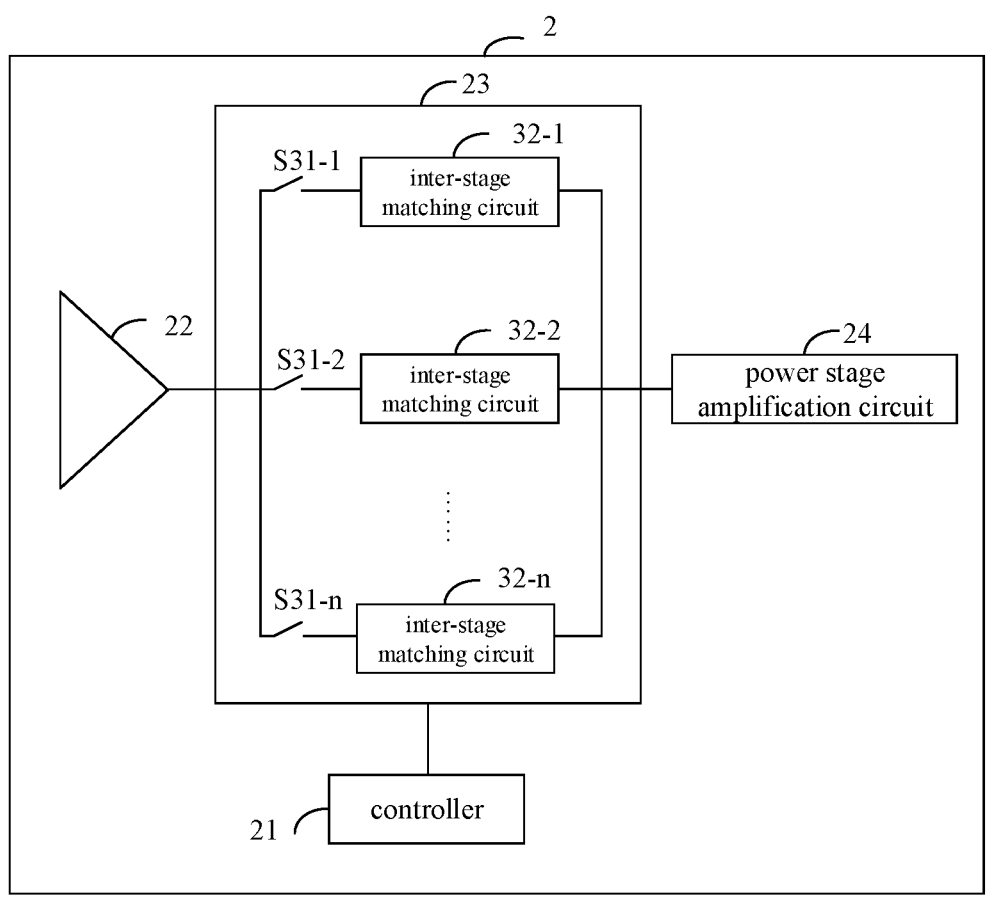
FIG. 4 is the third schematic structural diagram of a power control device provided by an embodiment of the disclosure.

In some embodiments, as shown in the power control device of FIG. 4, the adjustable inter-stage matching circuit 23 further includes multiple switches (for example, a switch S31-1, a switch S31-2 and a switch S31-$n$) connected in parallel, and the multiple switches are connected with the multiple inter-stage matching circuits (for example, an inter-stage matching circuit 32-1, an inter-stage matching circuit 32-2 and an inter-stage matching circuit 32-$n$) in one-to-one correspondence, and the multiple switches are connected with an output end of the driving element and the controller; and the controller 21 is further configured to determine, according to correspondences among the target frequency band, a preset frequency band and a matching circuit switch, a target switch from the multiple switches; and to control the target switch to be switched on and control other switches, except the target switch, of the multiple switches to be switched off; and to set an inter-stage matching circuit, connected with the target switch, of the multiple inter-stage matching circuits as the target inter-stage matching circuit; here n is a positive integer greater than 2.

In the embodiments of the disclosure, the controller 21 sets the switch, corresponding to the target frequency band, in the correspondences between the preset frequency band and the matching circuit switch as the target switch; the target inter-stage matching circuit is connected with the driving element 22 by controlling the target switch to be switched on and controlling other switches to be switched off; herein the correspondences between the preset frequency band and the matching circuit switch represent the switch connected to each of the inter-stage matching circuits for each of the frequency bands.

In some embodiments, the controller controls any of the multiple inter-stage matching circuits so that the inter-stage matching circuit is selected when a switch, correspondingly connected thereto, of the multiple switches is switched on; and controls any of the multiple inter-stage matching circuits so that the inter-stage matching circuit is not selected when a switch, correspondingly connected thereto, of the multiple switches is switched off.

In some embodiments, each of the multiple switches includes a transistor.

Figure 5:
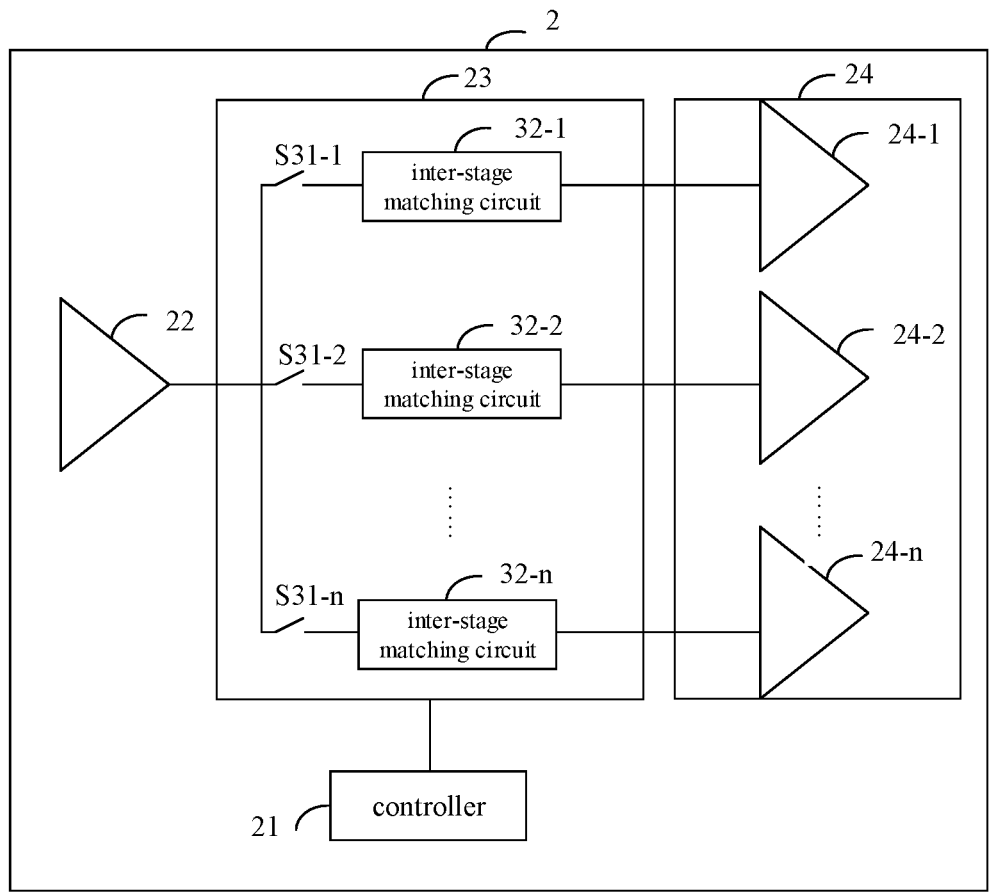
FIG. 5 is the fourth schematic structural diagram of a power control device provided by an embodiment of the disclosure.

In some embodiments, as shown in the power control device of FIG. 5, the power stage amplification circuit 24 includes multiple power amplifiers (for example, a power amplifier 24-1, a power amplifier 24-2 and a power amplifier 24-$n$), which are connected with the multiple inter-stage matching circuits in one-to-one correspondence; the controller 21 is further configured to, after determining the target inter-stage matching circuit of the path from the multiple inter-stage matching circuits, set an amplifier, connected with the target inter-stage matching circuit, of the multiple power amplifiers as a target power amplifier; and the target power amplifier is configured to amplify the intermediate input signal to obtain the output power signal.

In the embodiments of the disclosure, the driving element 22 is connected to one end of the target inter-stage matching circuit through the target switch, and the other end of the target inter-stage matching circuit is connected to the target power amplifier; and the target inter-stage matching circuit matches the output impedance of the driving element 22 and the input impedance of the target power amplifier to the target matching impedance, so that the target power amplifier obtains better performance parameters such as high gain, high output power, good linearity and high Power added efficiency (PAE) etc.

In some embodiments, each of the multiple inter-stage matching circuits and a power amplifier, correspondingly connected thereto, of the multiple power amplifiers are configured to transmit power signals within a frequency band with maximum efficiency.

It should be noted that the performance parameters (such as output power, gain, linearity, PAE, etc.) of the driving element and each of the multiple power amplifiers are affected by the matching impedance when they process power signals within any of the frequency bands respectively, therefore, for the input power signal within the target frequency band, the target inter-stage matching impedance is selected from the multiple inter-stage matching circuits, and the target inter-stage matching impedance performs impedance matching on the driving element and the target power amplifier base on the target matching impedance, the driving element and the target power amplifier process the input power signal within the target frequency band with better performance parameters.

Figure 6:
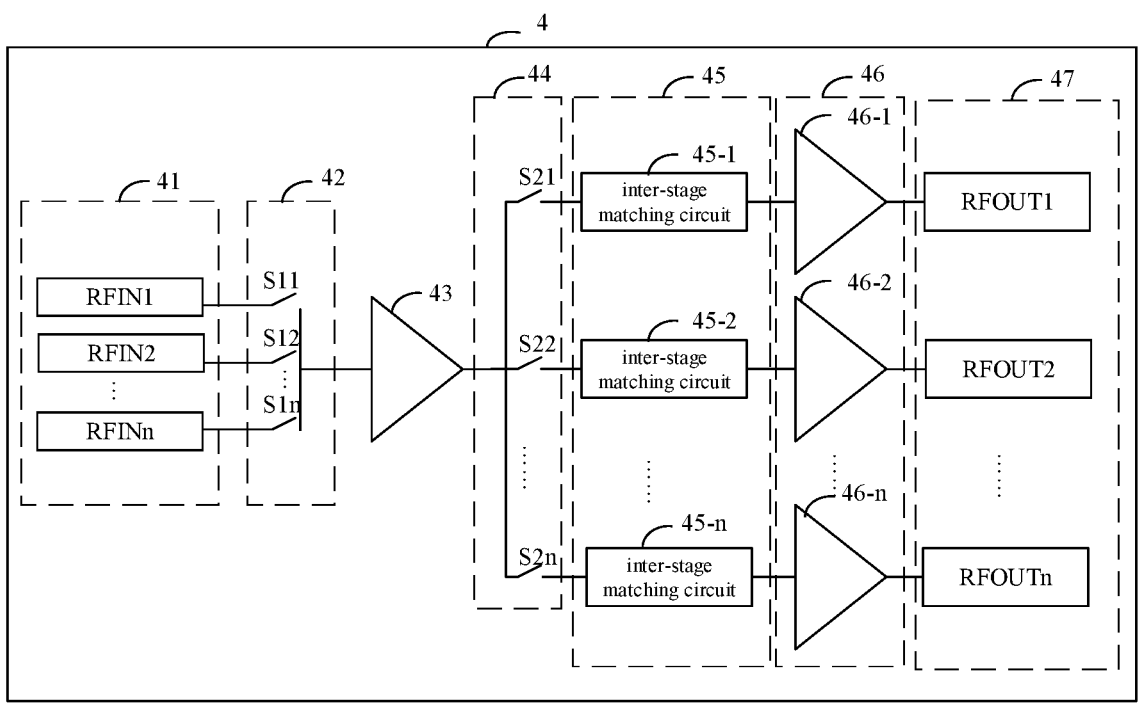
FIG. 6 is the fifth schematic structural diagram of a power control device provided by an embodiment of the disclosure.

In some embodiments, as shown in the power control device of FIG. 6, the power control device further includes multiple input matching circuits 41 and multiple input switches 42; and the multiple input matching circuits 41 are connected with the multiple input switches 42 in one-to-one correspondence, and the multiple input switches 42 are connected with the controller and an input end of the driving element 43; the controller is further configured to set an input switch, corresponding to the target inter-stage matching circuit, of the multiple input switches 42 as a target input switch; and to control the target input switch to be switched on and control other input switches, except the target input switch, of the multiple input switches 42 to be switched off; and to set an input matching circuit, connected with the target input switch, of the multiple input matching circuits 41 as a target input matching circuit; and the target input matching circuit is configured to transmit the input power signal to the driving element 43.

In the embodiments of the disclosure, the power control device 4 includes multiple input matching circuits 41, multiple input switches 42, a driving element 43, multiple switches 44, multiple inter-stage matching circuits 45, multiple power amplifiers 46 and multiple output matching circuits 47, and the multiple input matching circuits 41 are connected with the multiple input switches 42 in one-to-one correspondence, and the multiple input switches 42 are connected with the driving element 43 respectively, and the driving element 43 is connected with the multiple switches 44 which are connected with the multiple inter-stage matching circuits 45 in one-to-one correspondence, and the multiple inter-stage matching circuits 45 are connected with the multiple output matching circuits 47 in one-to-one correspondence; herein, the multiple input matching circuits 41 include an input matching circuit RFIN1, an input matching circuit RFIN2, . . . , and an input matching circuit RFINn; each of the multiple input matching circuits 41 matches the input impedance of the driving element 43; the multiple input switches 42 include an input switch S11, an input switch S12, . . . , and an input switch S1n; the multiple switches 44 include a switch S21, a switch S22, . . . , and a switch S2n; the multiple inter-stage matching circuits 45 include an inter-stage matching circuit 45-1, an inter-stage matching circuit 45-2, . . . , and an inter-stage matching circuit 45-n; the multiple power amplifiers 46 include a power amplifier 46-1, a power amplifier 46-2, . . . , and a power amplifier 46-n; the multiple output matching circuits 47 include an output matching circuit RFOUT1, an output matching circuit RFOUT2, . . . , and an output matching circuit RFOUTn; and each of the multiple output matching circuits 47 matches the output impedance of the connected power amplifier.

In the embodiments of the disclosure, when the power control device receives the frequency band selection instruction, and the target frequency band indicated by the frequency band selection instruction corresponds to the switch S21 connected with the inter-stage matching circuit 45-1, the power control device controls the switch S21 to be switched on and controls the switch S22 and the switch S23 to be switched off; and also controls the input switch S11 corresponding to the inter-stage matching circuit 45-1 to be switched on, and controls the input switch S12 and the input switch S13 to be switched off; the input power signal is transmitted to the driving element 43 after passing through the input matching circuit RFIN1 and the input switch S11; the driving element 43 pre-amplifies the input power signal to generate a pre-amplified power signal; the inter-stage matching circuit 45-1 makes the output impedance of the driving element 43 match with the input impedance of the power amplifier 46-1, and receives the pre-amplified power signal, and provides an intermediate input signal to the power amplifier 46-1; the power amplifier 46-1 amplifies the intermediate input signal to generate an output power signal, which is transmitted to the output matching circuit 47-1; and the output matching circuit 47-1 matches the output impedance of the power amplifier 46-1 and outputs the output power signal.

It should be noted that the process of the target frequency band corresponding to the switch S21 connected to the inter-stage matching circuit 45-1 is the same as that of the target frequency band corresponding to the switch S2i connected to the inter-stage matching circuit 45-i, and the power control device controls the input switch S1i and the switch S2i related to the inter-stage matching circuit 45-i to be switched on, and transmits, pre-amplifies and amplifies the input power signal to generate an output power signal, here i is chosen from 2 to n.

It may be understand that when a target frequency band is determined from a frequency band selection instruction, only a target inter-stage matching circuit path of multiple inter-stage matching circuits is selected, and then an input power signal within the target frequency band is pre-amplified by a driving element, processed by the target inter-stage matching circuit and amplified by a power amplification circuit to obtain an output power signal, and because the driving element is configured to pre-amplify the input power signal only, regardless of the frequency band, that is to say, no matter whether the input power signal belongs to any of the frequency bands, it may be pre-amplified by the same driving element, therefore, the topology of the power control device is simplified by sharing one driving element for each of the frequency bands, improving the space utilization.

Figure 7:
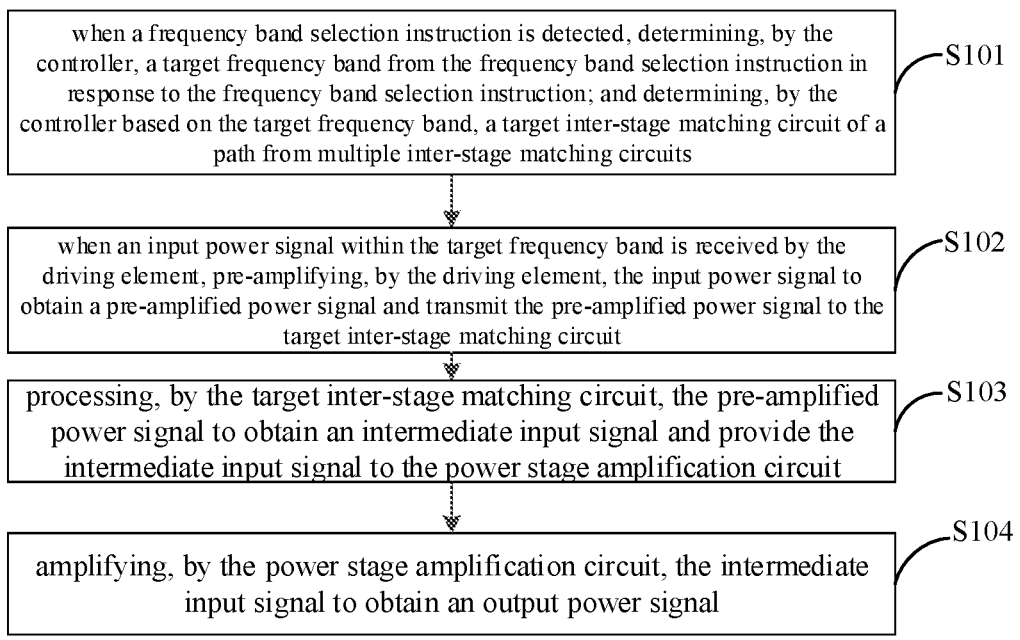
FIG. 7 is the flow chart of a power control method provided by an embodiment of the disclosure.

The embodiments of the disclosure provide a power control method applied to a power control device, as shown in FIG. 7, the power control method including:

In S101, when the frequency band selection instruction is detected, determining, by the controller, the target frequency band from the frequency band selection instruction in response to the frequency band selection instruction; and determining, by the controller based on the target frequency band, the target inter-stage matching circuit of the path from multiple inter-stage matching circuits;

when the controller in the power control device detects the frequency band selection instruction, the target frequency band is determined by the controller; a target inter-stage matching circuit whose operating frequency band is the target frequency band is determined from the multiple inter-stage matching circuits, and an operating path is formed by the target inter-stage matching circuit, a driving element and a power stage amplification circuit.

In some embodiments, determining, by the controller, the target switch from the multiple switches, according to correspondences among the target frequency band, the preset frequency band and the matching circuit switch; controlling, by the controller, the target switch to be switched on and controlling, by the controller, other switches, except the target switch, of the multiple switches to be switched off; and setting, by the controller, the inter-stage matching circuit, connected with the target switch, of the multiple inter-stage matching circuits as the target inter-stage matching circuit.

The controller sets the switch, corresponding to the target frequency band, in correspondences between the preset frequency band and the matching circuit switch as the target switch; the target inter-stage matching circuit is connected with the driving element by controlling the target switch to be switched on and controlling other switches to be switched off; herein the correspondences between the frequency band and the matching circuit switch represents the switch connected to each of the inter-stage matching circuits for each of the frequency bands.

In some embodiments, after determining, based on the target frequency band, the target inter-stage matching circuit of the path from the multiple inter-stage matching circuits, and before amplifying, by the power stage amplification circuit, the intermediate input signal to obtain the output power signal, setting, by the controller, the amplifier, connected with the target inter-stage matching circuit, of the multiple power amplifiers as the target power amplifier.

since one end of the multiple inter-stage matching circuits is connected with the driving element, the other end of the multiple inter-stage matching circuits is connected with multiple power stage amplifiers, and the power stage amplifier connected with the target inter-stage matching circuit is taken as the target power amplifier, at this time, the driving element is connected with one end of the target inter-stage matching circuit through the target switch, and the other end of the target inter-stage matching circuit is connected with the target power amplifier.

It should be noted that the target inter-stage matching circuit in the power control device makes the output impedance of the driving element and the input impedance of the target power amplifier match with the target matching impedance, so that the target power amplifier may obtain suitable performance parameters such as high gain, high output power, good linearity and high PAE etc.

In S102, when the input power signal within the target frequency band is received by the driving element, pre-amplifying, by the driving element, the input power signal to obtain the pre-amplified power signal and transmit the pre-amplified power signal to the target inter-stage matching circuit;

the driving element in the power control device receives and pre-amplifies the input power signal, and then transmits the pre-amplified power signal to the target inter-stage matching circuit.

In S103, processing, by the target inter-stage matching circuit, the pre-amplified power signal to obtain the intermediate input signal and provide the intermediate input signal to the power stage amplification circuit;

the target inter-stage matching circuit receives and transmits the pre-amplified power signal, and generates the intermediate input signal which is transmitted to the power stage amplification circuit.

In some embodiments, transmitting, by the target inter-stage matching circuit, the pre-amplified power signal by a preset capacitor and a preset inductor to obtain the intermediate input signal; and the preset capacitor and the preset inductor make the output impedance of the driving element match with the input impedance of the target power amplifier.

The capacitor in the target inter-stage matching circuit is set as the preset capacitor and the inductor in the target inter-stage matching circuit is set as the preset inductor; the target inter-stage matching circuit makes the output impedance of the connected driving element match with the input impedance of the target power amplifier by a preset inductor with a certain inductance value and a preset capacitor with a certain capacitance value; and after the pre-amplified power signal passes through the preset capacitor and the preset inductor in the target inter-stage circuit, the intermediate input signal is generated and provided to the target power amplifier.

In S104, amplifying, by the power stage amplification circuit, the intermediate input signal to obtain the output power signal.

The power stage amplification circuit in the power control device amplifies the intermediate input signal and generates the output power signal.

In some embodiments, the target power amplifier in the power control device amplifies the intermediate input signal to obtain the output power signal.

In some embodiments, before the pre-amplifying, by the driving element, the input power signal to obtain the pre-amplified power signal and transmit the pre-amplified power signal to the target inter-stage matching circuit, setting, by the controller, the input switch, corresponding to the target inter-stage matching circuit, of the multiple input switches as the target input switch; controlling, by the controller, the target input switch to be switched on and controlling, by the controller, other input switches, except the target input switch, of the multiple input switches to be switched off; setting, by the controller, the input matching circuit, connected with the target input switch, of the multiple input matching circuits as the target input matching circuit; and transmitting, by the target input matching circuit, the input power signal to the driving element.

In the embodiments of the disclosure, when the power control device receives the frequency band selection instruction, and the target frequency band indicated by the frequency band selection instruction corresponds to the target switch connected with the target inter-stage matching circuit, the power control device controls the target switch to be switched on and controls other switches to be switched off; and also controls the target input switch corresponding to the target inter-stage matching circuit to be switched on, and controls other input switch to be switched off; the input power signal is transmitted to the driving element after passing through the target input matching circuit and the target input switch; the driving element pre-amplifies the input power signal to generate a pre-amplified power signal; the target inter-stage matching circuit makes the output impedance of the driving element match with the input impedance of the target power amplifier, and receives the pre-amplified power signal, and provides an intermediate input signal to the target power amplifier; the target power amplifier amplifies the intermediate input signal to generate an output power signal, which is transmitted to the target output matching circuit; and the target output matching circuit matches the output impedance of the target power amplifier and outputs the output power signal.

It may be understand that when the power control device determines a target frequency band from a frequency band selection instruction, only a target inter-stage matching circuit path of multiple inter-stage matching circuits is selected, and then an input power signal within the target frequency band is pre-amplified by a driving element, processed by the target inter-stage matching circuit and amplified by a power amplification circuit to obtain an output power signal, and because the driving element is configured to pre-amplify the input power signal only, regardless of the frequency band, that is to say, no matter whether the input power signal belongs to any of the frequency bands, it may be pre-amplified by the same driving element, therefore, the topology of the power control device is simplified by sharing one driving element for each of the frequency bands, improving the space utilization.

The integrated modules described in the embodiments of the disclosure may also be stored in a computer storage medium when they are implemented in the form of software function modules and sold or used as independent products. Based on such understanding, it should be understood by those skilled in the art that the embodiments of the disclosure may be provided as methods, systems or computer program products. Therefore, the disclosure may take the form of an entire hardware embodiment, an entire software embodiment, or an embodiment combining software and hardware aspects. Furthermore, the embodiments of the disclosure may take the form of computer program products implemented on one or more computer storage media containing computer executable instructions therein, the storage media including USB flash drive, removable hard disk, read-only memory (ROM), Random Access Memory (RAM), magnetic disk memory, CD-ROM, optical memory, etc.

Accordingly, the embodiments of the disclosure provide a computer-readable storage medium, storing one or more programs which are executed by one or more processors to implement the power control method of the embodiments of the disclosure.

It should be understood by those skilled in the art that the embodiments of the disclosure may be provided as methods, systems or computer program products. Therefore, the disclosure may take the form of a hardware embodiment, a software embodiment, or an embodiment combining software and hardware aspects. Furthermore, the disclosure may take the form of a computer program product implemented on one or more computer usable storage media (including but not limited to magnetic disk memory, optical memory, etc.) containing computer usable program codes therein.

The disclosure is described with reference to at least one of flowcharts or block diagrams of methods, devices and computer program products according to the embodiments of the disclosure. It should be understood that each of at least one of flows or blocks in the at least one of flowcharts or block diagrams, and combinations of the at least one of flows or blocks in the at least one of flowcharts or block diagrams may be implemented by computer program instructions. These computer program instructions may be provided to a processor of a general purpose computer, a special purpose computer, an embedded processor or other programmable data processing devices to produce a machine, such that the instructions which are executed by the processor of the computer or other programmable data processing devices produce equipment for implementing the functions specified in at least one of one or more flows of the flowchart, or one or more blocks of the block diagrams.

These computer program instructions may also be stored in a computer-readable memory that may direct a computer or other programmable data processing devices to operate in a specific manner, such that the instructions stored in the computer-readable memory produce an article of manufacture including instruction equipment that implement the functions specified in at least one of one or more flows of the flowchart, or one or more blocks of the block diagram.

These computer program instructions may also be loaded onto a computer or other programmable data processing devices, such that a series of operational steps are performed on the computer or other programmable devices to produce a computer-implemented process, such that the instructions which are executed on the computer or other programmable devices provide steps for implementing the functions specified in at least one of one or more flows of the flowchart, or one or more blocks of the block diagrams.

In various embodiments of the disclosure, because the driving element is configured to pre-amplify the input power signal only, regardless of the frequency band, no matter whether the input power signal belongs to any of the frequency bands, it may be pre-amplified by the same driving element, thus simplifying the topology of the power control device by sharing one driving element for each of the frequency bands and improving the space utilization.

In several embodiments provided in the disclosure, it should be understood that the disclosed device and method may be implemented in other ways. The above-mentioned device embodiments are merely illustrative, for example, the division of the units is only a division based on logical functions, and there may be other divisions in actual implementations, e.g., multiple units or components may be combined, or may be integrated in another system, or some features may be ignored, or may not be performed. In addition, the coupling, or direct coupling, or communication connection between the components illustrated or discussed may be indirect coupling or communication connection through some interfaces, devices or units, which may be electrical, mechanical or otherwise.

The above-mentioned units illustrated as separate components may be or may not be physically separated, and the components illustrated as units may be or may not be physical units, i.e., they may be located in one place or distributed to multiple network units; some or all of the units may be selected according to actual needs to achieve the purpose of the solutions of the embodiments.

In addition, each functional unit in each of the embodiments of the disclosure may be all integrated in a processing unit, or each unit may be separately present as a single unit, or two or more units may be integrated in a single unit; the above integrated units may be realized either in the form of hardware or in the form of hardware together with software functional units.

Those ordinarily skilled in the art may understand that all or a part of the steps for realizing the above-mentioned embodiments of the method may be realized by hardware related to program instructions, and the above-mentioned program may be stored in a computer readable storage medium, and when the program is executed, the steps including the above-mentioned embodiments of the method are executed; and the above-mentioned storage medium includes various medium that may store program codes, such as mobile storage devices, Read-Only Memory (ROM), Random Access Memory (RAM), magnetic disks or optical disks, etc.

Or, the above integrated unit in the disclosure may also be stored in a computer-readable storage medium, when it is implemented as a software function module and sold or used as an individual product. Based on such understanding, the technical solutions of the embodiments of the disclosure substantially or the part contributing to the related art may be embodied in the form of a software product, and the computer software product is stored in a storage medium and includes several instructions to allow a computer device (which may be a personal computer, a server, or a network equipment, etc.) to execute all or part of the method described in each of the embodiments of the disclosure. And the aforementioned storage medium includes various medium that may store program codes, such as mobile storage devices, ROM, RAM, magnetic disks or optical disks etc.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

The above description includes part of embodiments of the present disclosure, and not limits the present disclosure. Any modifications, equivalent substitutions, improvements, etc., within the spirit and principles of the present disclosure, are included in the scope of protection of the present disclosure.

It is apparent that those of ordinary skill in the art can make various modifications and variations to the embodiments of the disclosure without departing from the spirit and scope of the disclosure. Thus, it is intended that the present disclosure cover the modifications and the modifications.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion within a process, method, article, or apparatus that comprises a list of elements including not only those elements but also those that are not explicitly listed, or other elements that are inherent to such processes, methods, goods, or equipment.

In the case of no more limitation, the element defined by the sentence "includes a . . . " does not exclude the existence of another identical element in the process, the method, or the device including the element.

Specific examples are used herein to describe the principles and implementations of some embodiments. The description is only used to help convey understanding of the possible methods and concepts. Meanwhile, those of ordinary skill in the art can change the specific manners of implementation and application thereof without departing from the spirit of the disclosure. The contents of this specification therefore should not be construed as limiting the disclosure.

For example, in the description of the present disclosure, the terms "some embodiments," or "example," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In the descriptions, with respect to circuit(s), unit(s), device(s), component(s), etc., in some occurrences singular forms are used, and in some other occurrences plural forms are used in the descriptions of various embodiments. It should be noted; however, the single or plural forms are not limiting but rather are for illustrative purposes. Unless it is expressly stated that a single unit, device, or component etc. is employed, or it is expressly stated that a plurality of units, devices or components, etc. are employed, the circuit(s), unit(s), device(s), component(s), etc. can be singular, or plural.

Based on various embodiments of the present disclosure, the disclosed apparatuses, devices, and methods can be implemented in other manners. For example, the abovementioned devices can employ various methods of use or implementation as disclosed herein.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

Dividing the device into different "regions," "units," "components" or "layers," etc. merely reflect various logical functions according to some embodiments, and actual implementations can have other divisions of "regions," "units," "components" or "layers," etc. realizing similar functions as described above, or without divisions. For example, multiple regions, units, or layers, etc. can be combined or can be integrated into another system. In addition, some features can be omitted, and some steps in the methods can be skipped.

Those of ordinary skill in the art will appreciate that the units, components, regions, or layers, etc. in the devices provided by various embodiments described above can be provided in the one or more devices described above. They can also be located in one or multiple devices that is (are) different from the example embodiments described above or illustrated in the accompanying drawings. For example, the units, regions, or layers, etc. in various embodiments described above can be integrated into one module or divided into several sub-modules.

The various device components, modules, units, blocks, or portions may have modular configurations, or are composed of discrete components, but nonetheless can be referred to as "modules" in general. In other words, the "components," "modules," "blocks," "portions," or "units" referred to herein may or may not be in modular forms, and these phrases may be interchangeably used.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

The order of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to the disclosed aspects of the exemplary embodiments can be made in addition to those described above by a person of ordinary skill in the art having the benefit of the present disclosure without departing from the spirit and scope of the disclosure contemplated by this disclosure and as defined in the following claims. As such, the scope of this disclosure is to be accorded the broadest reasonable interpretation so as to encompass such modifications and equivalent structures.

What is claimed is:

1. A power control device, comprising:
a controller;
a driving element;
an adjustable inter-stage matching circuit; and
a power stage amplification circuit,
wherein
the controller and the driving element are connected with the adjustable inter-stage matching circuit respectively, the adjustable inter-stage matching circuit is connected with the power stage amplification circuit; and the adjustable inter-stage matching circuit comprises a plurality of inter-stage matching circuits which are connected with the power stage amplification circuit;
the controller configured to, when a frequency band selection instruction is detected, determine a target frequency band from the frequency band selection instruction in response to the frequency band selection instruction; and to determine, based on the target frequency band, a target inter-stage matching circuit of a path from the plurality of inter-stage matching circuits;
the driving element configured to, when an input power signal within the target frequency band is received, pre-amplify the input power signal to obtain a pre-amplified power signal and transmit the pre-amplified power signal to the target inter-stage matching circuit;
the target inter-stage matching circuit configured to process the pre-amplified power signal to obtain an intermediate input signal and provide the intermediate input signal to the power stage amplification circuit; and
the power stage amplification circuit configured to amplify the intermediate input signal to obtain an output power signal.

2. The device of claim 1, wherein
the adjustable inter-stage matching circuit further comprises a plurality of switches connected in parallel, the plurality of switches are connected with the plurality of inter-stage matching circuits in one-to-one correspondence, and the plurality of switches are connected with an output end of the driving element and the controller; and
the controller is further configured to determine, according to correspondences among the target frequency band, a preset frequency band and a matching circuit switch, a target switch from the plurality of switches; and to control the target switch to be switched on and control other switches, except the target switch, of the plurality of switches to be switched off;
and to set an inter-stage matching circuit, connected with the target switch, of the plurality of inter-stage matching circuits as the target inter-stage matching circuit.

3. The device of claim 1, wherein
the power stage amplification circuit comprises a plurality of power amplifiers which are connected with the plurality of inter-stage matching circuits in one-to-one correspondence;
the controller is further configured to, after determining the target inter-stage matching circuit of the path from the plurality of inter-stage matching circuits, set an amplifier, connected with the target inter-stage matching circuit, of the plurality of power amplifiers as a target power amplifier; and
the target power amplifier is configured to amplify the intermediate input signal to obtain the output power signal.

4. The device of claim 3, wherein
the target inter-stage matching circuit is further configured to transmit, by a preset capacitor and a preset inductor, the pre-amplified power signal to obtain the intermediate input signal; and
the preset capacitor and the preset inductor make an output impedance of the driving element match with an input impedance of the target power amplifier.

5. The device of the claim 3, wherein each of the plurality of inter-stage matching circuits and a power amplifier, correspondingly connected thereto, of the plurality of power amplifiers are configured to transmit power signals within a frequency band with maximum efficiency.

6. The device of claim 5, wherein
a power control device further comprises a plurality of input matching circuits and a plurality of input switches; and the plurality of input matching circuits are connected with the plurality of input switches in one-to-one correspondence, and the plurality of input switches are connected with the controller and an input end of the driving element;
the controller is further configured to set an input switch, corresponding to the target inter-stage matching circuit, of the plurality of input switches as a target input switch; and to control the target input switch to be switched on and control other input switches, except the target input switch, of the plurality of input switches to be switched off; and to set an input matching circuit, connected with the target input switch, of the plurality of input matching circuits as a target input matching circuit; and
the target input matching circuit is configured to transmit the input power signal to the driving element.

7. A wireless communication apparatus comprising the power control device of claim 1, wherein
when a target frequency band is determined from a frequency band selection instruction, only a target inter-stage matching circuit path of multiple inter-stage matching circuits is selected, and then an input power signal within the target frequency band is pre-amplified by a driving element, processed by the target inter-stage matching circuit and amplified by a power amplification circuit to obtain an output power signal; and
the driving element is configured to pre-amplify the input power signal only, regardless of the frequency band, thereby simplifying topology of the power control device by sharing one driving element for each of the frequency bands, and improving the space utilization.

8. The apparatus of claim 7, wherein
the adjustable inter-stage matching circuit further comprises a plurality of switches connected in parallel, the plurality of switches are connected with the plurality of inter-stage matching circuits in one-to-one correspondence, and the plurality of switches are connected with an output end of the driving element and the controller; and the controller is further configured to determine, according to correspondences among the target frequency band, a preset frequency band and a matching circuit switch, a target switch from the plurality of switches; and to control the target switch to be switched on and control other switches, except the target switch, of the plurality of switches to be switched off; and to set an inter-stage matching circuit, connected with the target switch, of the plurality of inter-stage matching circuits as the target inter-stage matching circuit.

9. The apparatus of claim 7, wherein the power stage amplification circuit comprises a plurality of power amplifiers which are connected with the plurality of inter-stage matching circuits in one-to-one correspondence;

the controller is further configured to, after determining the target inter-stage matching circuit of the path from the plurality of inter-stage matching circuits, set an amplifier, connected with the target inter-stage matching circuit, of the plurality of power amplifiers as a target power amplifier; and the target power amplifier is configured to amplify the intermediate input signal to obtain the output power signal.

10. The apparatus of claim 9, wherein the target inter-stage matching circuit is further configured to transmit, by a preset capacitor and a preset inductor, the pre-amplified power signal to obtain the intermediate input signal; and the preset capacitor and the preset inductor make an output impedance of the driving element match with an input impedance of the target power amplifier.

11. The apparatus of the claim 9, wherein each of the plurality of inter-stage matching circuits and a power amplifier, correspondingly connected thereto, of the plurality of power amplifiers are configured to transmit power signals within a frequency band with maximum efficiency.

12. The apparatus of claim 11, wherein a power control device further comprises a plurality of input matching circuits and a plurality of input switches; and the plurality of input matching circuits are connected with the plurality of input switches in one-to-one correspondence, and the plurality of input switches are connected with the controller and an input end of the driving element;

the controller is further configured to set an input switch, corresponding to the target inter-stage matching circuit, of the plurality of input switches as a target input switch; and to control the target input switch to be switched on and control other input switches, except the target input switch, of the plurality of input switches to be switched off; and to set an input matching circuit, connected with the target input switch, of the plurality of input matching circuits as a target input matching circuit; and the target input matching circuit is configured to transmit the input power signal to the driving element.

13. A power control method, applied to the power control device of claim 1, the method comprising:

when the frequency band selection instruction is detected, determining, by the controller, the target frequency band from the frequency band selection instruction in response to the frequency band selection instruction; and determining, by the controller based on the target frequency band, the target inter-stage matching circuit of the path from the plurality of inter-stage matching circuits;

when the input power signal within the target frequency band is received by the driving element, pre-amplifying, by the driving element, the input power signal to obtain the pre-amplified power signal and transmit the pre-amplified power signal to the target inter-stage matching circuit;

processing, by the target inter-stage matching circuit, the pre-amplified power signal to obtain the intermediate input signal and provide the intermediate input signal to the power stage amplification circuit; and amplifying, by the power stage amplification circuit, the intermediate input signal to obtain the output power signal.

14. The method of claim 13, wherein the determining, based on the target frequency band, the target inter-stage matching circuit of the path from the plurality of inter-stage matching circuits, comprises:

determining, by the controller, the target switch from the plurality of switches, according to correspondences among the target frequency band, the preset frequency band and the matching circuit switch;

controlling, by the controller, the target switch to be switched on and controlling, by the controller, other switches, except the target switch, of the plurality of switches to be switched off; and setting, by the controller, the inter-stage matching circuit, connected with the target switch, of the plurality of inter-stage matching circuits as the target inter-stage matching circuit.

15. The method of claim 14, further comprising:

after determining, based on the target frequency band, the target inter-stage matching circuit of the path from the plurality of inter-stage matching circuits, and before amplifying, by the power stage amplification circuit, the intermediate input signal to obtain the output power signal, setting, by the controller, the amplifier, connected with the target inter-stage matching circuit, of the plurality of power amplifiers as the target power amplifier;

correspondingly, the amplifying, by the power stage amplification circuit, the intermediate input signal to obtain the output power signal, comprising:

amplifying, by the target power amplifier, the intermediate input signal to obtain the output power signal.

16. The method of claim 15, wherein the processing, by the target inter-stage matching circuit, the pre-amplified power signal to obtain the intermediate input signal and provide the intermediate input signal to the power stage amplification circuit, comprises:

transmitting, by the target inter-stage matching circuit, the pre-amplified power signal by the preset capacitor and the preset inductor to obtain the intermediate input signal; and the preset capacitor and the preset inductor make the output impedance of the driving element match with the input impedance of the target power amplifier.

17. The method of claim 16, further comprising:

before the pre-amplifying, by the driving element, the input power signal to obtain the pre-amplified power signal and transmit the pre-amplified power signal to the target inter-stage matching circuit;

setting, by the controller, the input switch, corresponding to the target inter-stage matching circuit, of the plurality of input switches as the target input switch;

controlling, by the controller, the target input switch to be switched on and controlling, by the controller, other input switches, except the target input switch, of the plurality of input switches to be switched off;

setting, by the controller, the input matching circuit, connected with the target input switch, of the plurality of input matching circuits as the target input matching circuit; and transmitting, by the target input matching circuit, the input power signal to the driving element.

18. A non-transitory computer-readable storage medium having instructions stored therein for execution by a processing circuit to implement operations of the method of claim 13.

* * * * *